(12) United States Patent
Maruyama et al.

(10) Patent No.: US 10,164,384 B2
(45) Date of Patent: Dec. 25, 2018

(54) COAXIAL CONNECTOR

(71) Applicant: Hirose Electric Co., Ltd., Tokyo (JP)

(72) Inventors: Akihiro Maruyama, Tokyo (JP); Takashi Sawai, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/657,189

(22) Filed: Jul. 23, 2017

(65) Prior Publication Data

US 2018/0048101 A1 Feb. 15, 2018

(30) Foreign Application Priority Data

Aug. 9, 2016 (JP) ................. 2016-156659

(51) Int. Cl.

| H01R 24/50 | (2011.01) |
|---|---|
| H01R 9/05 | (2006.01) |
| H01R 12/00 | (2006.01) |
| H05K 3/30 | (2006.01) |
| H05K 3/34 | (2006.01) |
| H01R 13/6474 | (2011.01) |
| H05K 1/11 | (2006.01) |
| H05K 1/18 | (2006.01) |
| H01P 1/04 | (2006.01) |

(Continued)

(52) U.S. Cl.
CPC .......... *H01R 24/50* (2013.01); *H01R 9/0518* (2013.01); *H01R 9/095* (2013.01); *H01R 13/6474* (2013.01); *H05K 1/111* (2013.01); *H05K 1/181* (2013.01); *H05K 3/308* (2013.01); *H05K 3/3405* (2013.01); *H01P 1/045* (2013.01); *H01P 5/085* (2013.01); *H05K 1/0243* (2013.01); *H05K 2201/09809* (2013.01); *H05K 2201/10189* (2013.01)

(58) Field of Classification Search
CPC ............................. H01R 24/50; H01R 9/0515
USPC ..................................... 439/63, 581
See application file for complete search history.

(56) References Cited

U.S. PATENT DOCUMENTS

| 5,078,621 A * | 1/1992 | Nishikawa | H01R 24/50 439/581 |
|---|---|---|---|
| 5,322,453 A * | 6/1994 | Resnick | H01R 24/50 439/581 |

(Continued)

FOREIGN PATENT DOCUMENTS

JP 20150095326 5/2015

*Primary Examiner* — Ross N Gushi
(74) *Attorney, Agent, or Firm* — Procopio, Cory, Hargreaves & Savitch LLP

(57) ABSTRACT

A coaxial connector mounted to a board, wherein a center conductor is provided with a contact portion in contact with the terminal of a counterpart connector. A first coupling portion couples to the contact portion and extends in the axial direction of an outer conductor. A bend portion couples to the first coupling portion and is bent in the radial direction of the outer conductor. A second coupling portion couples to the bend portion and extends in the radial direction of the outer conductor. A connecting portion couples to the second coupling portion and connects said center conductor to on-board circuitry. A first and second expanded portion produced by an expansion of a portion of the outer peripheral surface of said first and second coupling portions, is formed in the first and second coupling portions.

9 Claims, 11 Drawing Sheets

(51) Int. Cl.
 *H05K 1/02* (2006.01)
 *H01P 5/08* (2006.01)

(56) References Cited

U.S. PATENT DOCUMENTS

| | | | | |
|---|---|---|---|---|
| 5,466,160 A * | 11/1995 | Ogura | | H01R 24/50 333/260 |
| 6,257,927 B1 * | 7/2001 | Suzuki | | H01R 23/688 439/579 |
| 6,264,475 B1 * | 7/2001 | Machado | | H01R 24/52 439/63 |
| 6,474,995 B1 * | 11/2002 | Wu | | H01R 24/50 439/63 |
| 6,533,610 B1 * | 3/2003 | Dai | | H01R 24/50 439/581 |
| 6,776,621 B1 * | 8/2004 | Dye | | H01R 24/50 439/63 |
| 6,902,408 B2 * | 6/2005 | Yamane | | H01R 24/50 439/581 |
| 6,905,364 B2 * | 6/2005 | Swantner | | H01R 24/50 439/541.5 |
| 7,118,383 B2 * | 10/2006 | Nagata | | H01R 13/6315 439/63 |
| 7,217,156 B2 * | 5/2007 | Wang | | H01R 4/184 439/579 |
| 7,334,327 B1 * | 2/2008 | Chen | | H01R 43/24 264/104 |
| 7,367,811 B2 * | 5/2008 | Nagata | | H01R 24/50 439/63 |
| 7,651,334 B2 * | 1/2010 | Zhang | | H01R 24/50 439/581 |
| 7,651,335 B2 * | 1/2010 | Chen | | H01R 13/41 439/63 |
| 7,976,315 B2 * | 7/2011 | Zuinen | | H01R 9/0515 439/63 |
| 7,985,076 B2 * | 7/2011 | Zuinen | | H01R 24/50 439/63 |
| 7,993,144 B2 * | 8/2011 | Hu | | H01R 13/405 439/63 |
| 8,087,940 B1 * | 1/2012 | Lee | | H01R 24/50 439/63 |
| 8,123,555 B2 * | 2/2012 | Chen | | H01R 43/24 439/578 |
| 8,262,398 B2 * | 9/2012 | Chen | | H01R 24/50 439/188 |
| 8,298,007 B2 * | 10/2012 | Taguchi | | H01R 13/6473 439/578 |
| 8,414,306 B2 * | 4/2013 | Tagawa | | H01R 24/50 439/63 |
| 8,512,073 B2 * | 8/2013 | Takano | | H01R 24/50 439/578 |
| 8,657,608 B2 * | 2/2014 | Tsai | | H01R 24/50 439/581 |
| 8,721,347 B2 * | 5/2014 | Xiao | | H01R 24/50 439/63 |
| 8,911,240 B2 * | 12/2014 | Biddle | | H01R 12/7005 439/63 |
| 9,172,194 B2 * | 10/2015 | Maruyama | | H01R 24/38 |
| 9,276,364 B2 * | 3/2016 | Mitsuno | | H01R 33/205 |
| 2005/0026498 A1 * | 2/2005 | Ikeda | | H01R 9/0518 439/582 |

* cited by examiner

——————— A coaxial connector of Embodiment 1 of the present invention
·············· A coaxial connector of Comparative Example 1
— · — · — A coaxial connector of Comparative Example 2
- - - - - - - A coaxial connector of Comparative Example 3

(1)

(2)

——————— A coaxial connector of Embodiment 1 of the present invention

·················· A coaxial connector of Embodiment 3 of the present invention

Top
Bottom

———— A coaxial connector of Embodiment 1 of the present invention

·········· A coaxial connector of Embodiment 4 of the present invention

COAXIAL CONNECTOR

CROSS REFERENCE TO RELATED APPLICATIONS

This Paris Convention patent application claims benefit under 35 U.S.C. § 119 and claims priority to Japanese Patent Application No. JP 2016-156659, filed on Aug. 9, 2016, titled "COAXIAL CONNECTOR", the content of which is incorporated herein in its entirety by reference for all purposes.

BACKGROUND

Technical Field

The present invention relates to a board-mounted coaxial connector.

Background Art

Board-mounted type coaxial connectors can be used as means for interconnecting circuitry formed on a board and devices independent of the board via a coaxial cable. If the signals handled by the above-mentioned circuitry and devices are high-frequency signals, it is important to make the impedance of the coaxial connector match the input impedance or output impedance of the circuitry.

The impedance of a coaxial connector varies depending on the structural elements of the coaxial connector, such as the shape and dimensions of the center conductor and outer conductor, as well as the distance between the center conductor and outer conductor, and the like. When a coaxial connector is designed, the impedance of the coaxial connector is made to match the input impedance of the circuitry, etc., by appropriately adjusting these structural elements.

Patent Document 1 below describes an example in which the impedance of a coaxial connector is adjusted by adjusting the structural elements of the coaxial connector.

PRIOR ART DOCUMENT

Patent Documents

Patent Document 1: Japanese Patent Application No. 2015-95326

SUMMARY

Problems to be Solved by the Invention

Systems and methods described herein are configured to enhance impedance matching characteristics with respect to circuitry and the like in a coaxial connector whose structure incorporates a center conductor bent in a substantially L-shaped configuration.

Incidentally, among this type of board-mounted coaxial connectors, there are coaxial connectors in which the outer conductor is disposed on the board such that its axial line is perpendicular to the surface of the board. On the other hand, the center conductor is formed in a substantially L-shaped configuration such that, in the center conductor, the portion that is in contact with the terminal of a counterpart connector extends in a direction perpendicular to the surface of the board and the portion that is connected to on-board circuitry extends in a direction parallel to the surface of the board. The coaxial connector described in the above-mentioned Patent Document 1 also has this type of structure. When handling high-frequency signals using coaxial connectors of such structure, especially when handling high-frequency signals in the quasi-millimeter wave band with frequencies generally in the range of 20 GHz to 30 GHz or in the millimeter wave band with frequencies generally in the range of 30 GHz and higher, it is not easy to make the impedance of the coaxial connector match the input impedance of the circuitry.

It is believed that important factors here include the fact that the center conductor is L-shaped and thus its shape is more complicated in comparison with linear shapes; in addition, since the center conductor is L-shaped, the distance between the center conductor and outer conductor varies considerably depending on the portion of the center conductor, etc. Furthermore, another important factor to consider is the fact that the frequencies of the signals being handled are extremely high. Specifically, when the signals being handled approach the quasi-millimeter wave band or are in the quasi-millimeter wave band, or when they are in the millimeter wave band, it becomes substantially more difficult to control the impedance of the coaxial connector by adjusting the structural elements of the coaxial connector than in lower frequency bands.

The present invention was made by considering problems such as the ones described above and it is an object of the invention to provide a coaxial connector whose structure incorporates a center conductor bent in a substantially L-shaped configuration and which is capable of enhancing impedance matching characteristics with respect to circuitry and the like.

Means for Solving the Problems

In order to eliminate the foregoing problems, the inventive coaxial connector, which is a board-mounted coaxial connector provided with a tubular outer conductor and a center conductor provided inside the outer conductor, is characterized by the fact that the center conductor is provided with a contact portion, which is in contact with the terminal of a counterpart connector; a first coupling portion, which couples to the contact portion and extends in the axial direction of the outer conductor; a bend portion, which couples to the first coupling portion and is bent in the radial direction of the outer conductor; a second coupling portion, which couples to the bend portion and extends in the radial direction of the outer conductor; and a connecting portion, which couples to the second coupling portion and connects said center conductor to on-board circuitry, and that a first expanded portion, which is produced by an expansion of a portion of the outer peripheral surface of said first coupling portion, is formed in the first coupling portion, and a second expanded portion, which is produced by an expansion of a portion of the outer peripheral surface of said second coupling portion, is formed in the second coupling portion.

In the inventive coaxial connector, providing the first expanded portion and the second expanded portion respectively on both sides of the bend portion of the center conductor makes it possible to enhance impedance matching characteristics with respect to circuitry and the like.

In addition, in the above-described inventive coaxial connector, the first expanded portion is preferably shaped as a cylinder having a diameter larger than the diameter of the first coupling portion. Furthermore, the second expanded portion is preferably shaped as a cylinder having a diameter larger than the diameter of the second coupling portion. Also, the first expanded portion is preferably disposed coaxially with the first coupling portion. In addition, the second expanded portion is preferably disposed coaxially with the second coupling portion. Further, the second expanded portion is preferably disposed inwardly of the outer peripheral surface of the outer conductor.

Furthermore, in the above-described inventive coaxial connector, on the surface of the board, a conductive region, which has laid down therein a conductor pattern, is preferably formed in a portion corresponding to the end face of the end portion of the outer conductor on the side proximate the board; a non-conductive region, which has no conductor pattern laid down therein, is preferably formed in a portion corresponding to the space inside the end portion of the outer conductor; and the second expanded portion is preferably disposed in the non-conductive region.

In addition, in the above-described inventive coaxial connector, there is preferably provided an insulating member that supports the center conductor on the outer conductor; the insulating member is preferably provided with an access hole, which permits passage of the contact portion, a receiving portion, which is a hole with a diameter larger than the diameter of the access hole and which receives the first expanded portion, and a stepped portion, which is formed between the access hole and the receiving portion; and the first expanded portion abuts the stepped portion.

Furthermore, in the above-described inventive coaxial connector, the second coupling portion of the center conductor may have an adjustment portion, which is formed by partially changing the diameter dimensions of the second coupling portion, in a portion located farther in the radial direction of the outer conductor than the second expanded portion.

Effects of the Invention

The present invention makes it possible to enhance impedance matching characteristics with respect to circuitry and the like in a coaxial connector whose structure incorporates a center conductor bent in a substantially L-shaped configuration.

DETAILED DESCRIPTION

Figure 1:
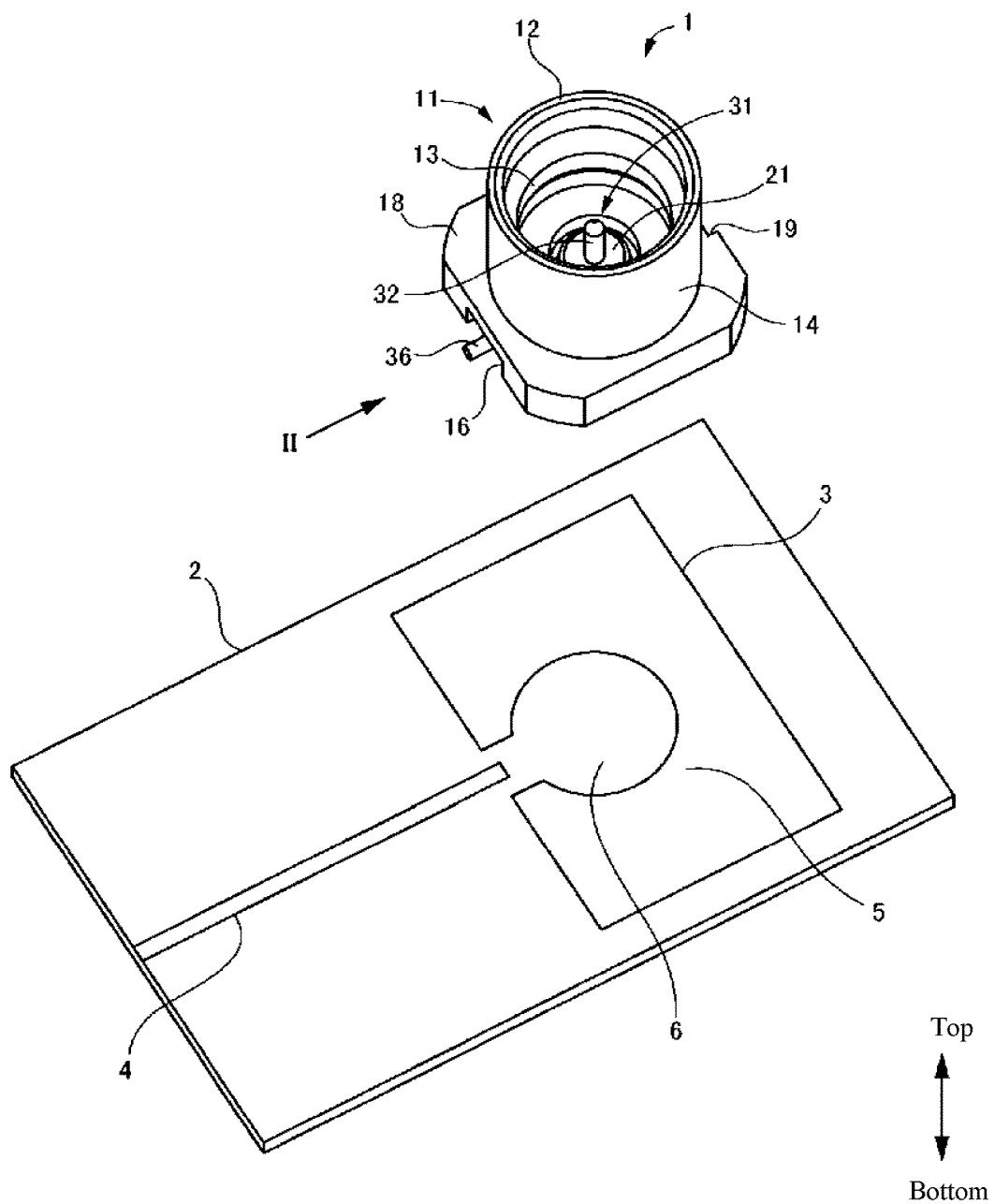
FIG. 1 illustrates an external view illustrating a board and a coaxial connector according to Embodiment 1 of the present invention prior to mounting to the board.
Figure 2:
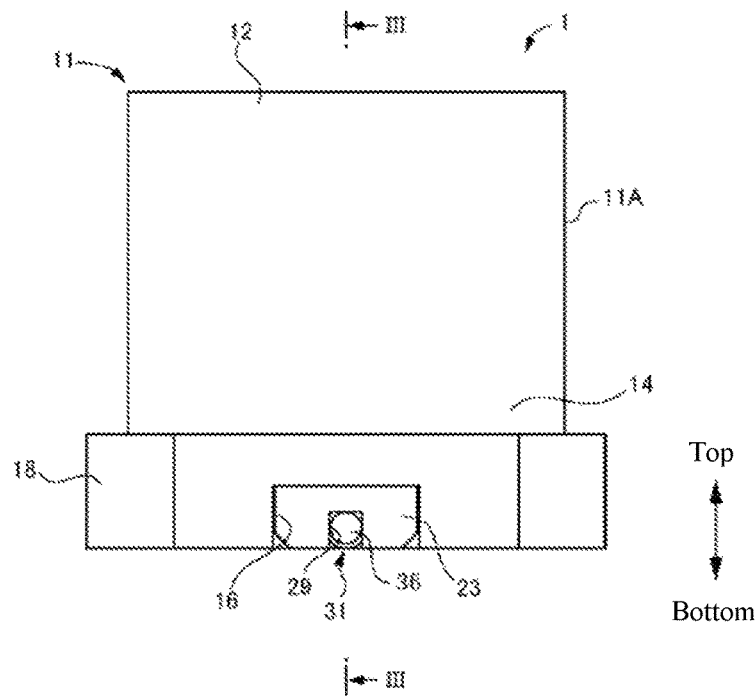
FIG. 2 illustrates an external view of a coaxial connector according to Embodiment 1 of the present invention as viewed from the direction of arrow II in FIG. 1.
Figure 3:
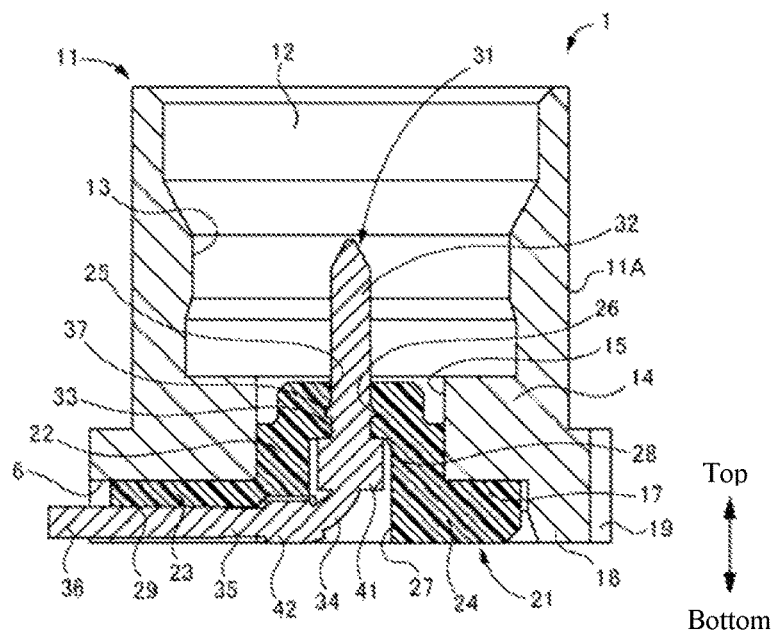
FIG. 3 illustrates a cross-sectional view of a coaxial connector according to Embodiment 1 of the present invention as viewed from the direction of arrow in FIG. 2.
Figure 4:
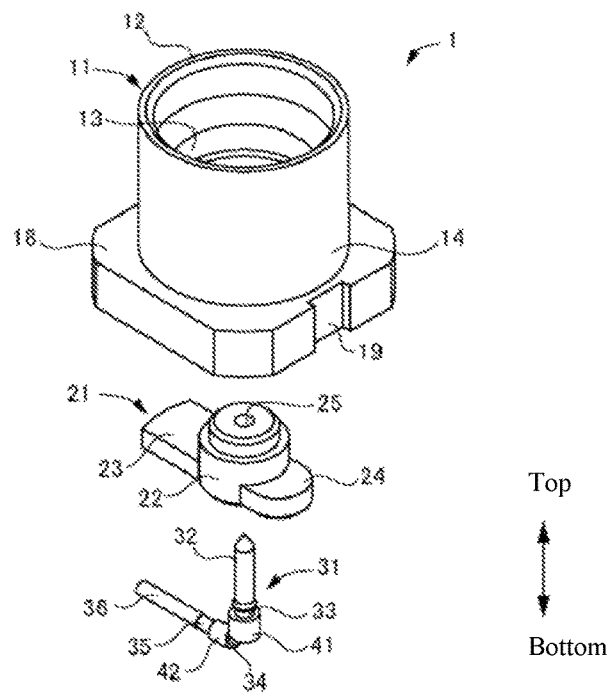
FIG. 4 illustrates an exploded view of a coaxial connector according to Embodiment 1 of the present invention as viewed from above.
Figure 5:
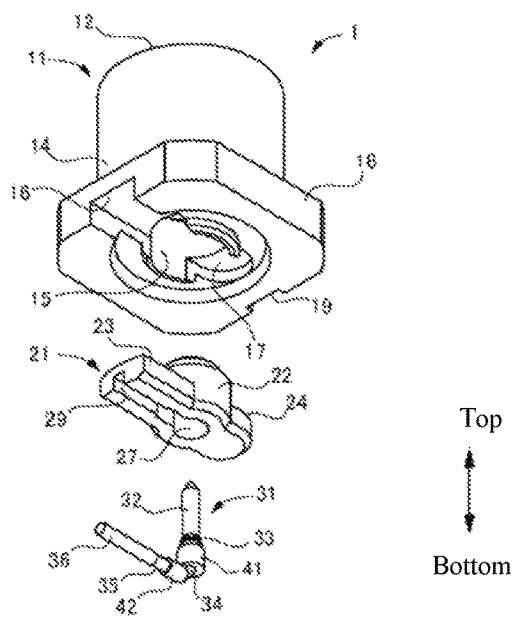
FIG. 5 illustrates an exploded view of a coaxial connector according to Embodiment 1 of the present invention as viewed from below.

FIG. 1 illustrates a state prior to the mounting of a coaxial connector 1 according to Embodiment 1 of the present invention to a board 2. FIG. 2 illustrates the coaxial connector 1 as viewed from the direction of arrow II in FIG. 1 and FIG. 3 illustrates a cross-section of the coaxial connector 1 as viewed from the direction of arrow in FIG. 2. FIG. 4 is an exploded view of the coaxial connector 1 as viewed from above and FIG. 5 is an exploded view of the coaxial connector 1 as viewed from below. It should be noted that, for purposes of explanation, the discussion below uses examples in which the board 2 is placed horizontally and the coaxial connector 1 is mounted to the upper surface of the board 2.

In FIG. 1, the coaxial connector 1 is a board-mounted type coaxial connector mounted to the surface of the board 2. The coaxial connector 1 is mounted to the board 2 such that its axial line is perpendicular to the surface of the board 2. Inserting a counterpart connector in the coaxial connector 1 from above the board 2 can establish an electrical connection between the counterpart connector and the circuitry formed on the board 2. The coaxial connector 1 is provided with an outer conductor 11, a center conductor 31, and an insulating member 21, which supports the insulated center conductor 31 on the outer conductor 11. The board 2 can be, for example, a Teflon (registered trademark) substrate or a ceramic substrate with conductor patterns 3, 4 formed on its front surface and a conductor film formed on its entire back surface. The conductor patterns 3, 4 are part of the circuitry.

In the coaxial connector 1, the outer conductor 11 serves as an outer shell for the coaxial connector 1 and as electrical connection means for grounding and the like. In addition, the outer conductor 11 also serves as means for securing the coaxial connector 1 to the board 2. The outer conductor 11 is formed in the shape of a cylinder by machining a metallic rod made of, for example, brass, phosphor bronze, or the like. It should be noted that while the outer conductor 11 can also be formed by bending a metallic plate in the shape of a cylinder, forming the outer conductor 11 by machining a metallic rod makes it possible to increase the accuracy of the impedance of the coaxial connector 1. In addition, the surface of the outer conductor 11 is plated with nickel, for example, and then is further plated thereupon with gold or tin. While there are no limits on the size of the outer conductor 11, it can have, for instance, a diameter of 3-10 mm and a height of 4-12 mm.

As shown in FIG. 2, a mating portion 12, into which a counterpart connector fits in a detachable manner, is formed in the upper part of the outer conductor 11. In addition, as shown in FIG. 3, a connector engagement portion 13, which is used to engage the counterpart connector inserted in the mating portion 12, is formed on the inner peripheral side of the mating portion 12. The connector engagement portion 13 protrudes inwardly in the radial direction from the inner peripheral surface of the mating portion 12 around its entire circumference.

A support portion 14, which supports the center conductor 31 through the medium of the insulating member 21, is formed on the inner peripheral side of the lower part of the outer conductor 11. As shown in FIG. 5, the insulating member 21 is inserted into the support portion 14 from below. The support portion 14 has an insertion portion 15, into which the stem portion 22 of the insulating member 21 is inserted. As shown in FIG. 3, the insertion portion 15 has an inside diameter that is smaller than the inside diameter of the mating portion 12. In addition, the support portion 14 has a groove portion 16, into which one of the prong portions 23 of the insulating member 21 is inserted. The groove portion 16 is formed in the lower end surface of the outer conductor 11 and extends from the edge portion of the insertion portion 15 in the radial direction of the outer conductor 11 through the space separating it from the outer peripheral surface of the securing portion 18. Furthermore, the support portion 14 is provided with a recessed portion 17, into which the other prong portion 24 of the insulating member 21 is inserted. The recessed portion 17 is formed in a portion opposite the portion where the groove portion 16 is formed in the lower end surface of the outer conductor 11. It should be noted that the above-described shape of the support portion 14 is merely an example and not a limitation.

In addition, a securing portion 18, which connects and secures the outer conductor 11 to the conductor pattern 3 of the board 2 by soldering, is formed on the outer peripheral side of the lower part of the outer conductor 11. The securing portion 18 is formed in a flange-like configuration in which the lower end portion of the outer peripheral surface of the outer conductor 11 expands outwardly in the radial direction. As shown in FIG. 5, when the outer conductor 11 is viewed from below, it can be seen that the securing portion 18 is formed in a generally square configuration with an indentation 19, which shows the orientation of the coaxial connector 1 in the circumferential direction, formed in a portion of the outer peripheral surface of the securing portion 18. It should be noted that the above-described shape of the securing portion 18 is merely an example and not a limitation.

In the coaxial connector 1, the insulating member 21 is made of an insulating material, for example, a liquid crystal polymer or another resin. As shown in FIG. 4, the insulating member 21 has a cylindrical stem portion 22 and a pair of prong portions 23, 24 that are formed respectively in the radial direction on both sides of the stem portion 22 and respectively extend outwardly in the radial direction. In addition, as shown in FIG. 3, an access hole 25, which permits passage of the contact portion 32 of the center conductor 31, is formed in the upper central part of the stem portion 22. In addition, a groove-shaped engagement portion 26, which is used to bring the center conductor 31 into engagement with the insulating member 21, is formed in the inner surface of the access hole 25. In addition, a receiving portion 27, which is a hole that receives the first coupling portion 33, the first expanded portion 41, and the bend portion 34 of the center conductor 31, is formed in the lower central part of the stem portion 22. In addition, the receiving portion 27 has a diameter larger than the diameter of the access hole 25 and a stepped portion 28 is formed between the access hole 25 and the receiving portion 27. The first expanded portion 41 abuts the stepped portion 28. In addition, a space is formed between the bend portion 34 and the insulating member 21 in the receiving portion 27. Since the bend portion 34 is not in contact with the insulating member 21 and air is present therebetween, the insertion loss of the coaxial connector 1 can be reduced. Furthermore, a slot 29 is formed in the lower end surface of the prong portion 23 of the insulating member 21 to extend therethrough in the radial direction. The second coupling portion 35 and second expanded portion 42 of the center conductor 31 are inserted into the slot 29. It should be noted that the above-described shape of the insulating member 21 is merely an example and not a limitation.

Figure 6:
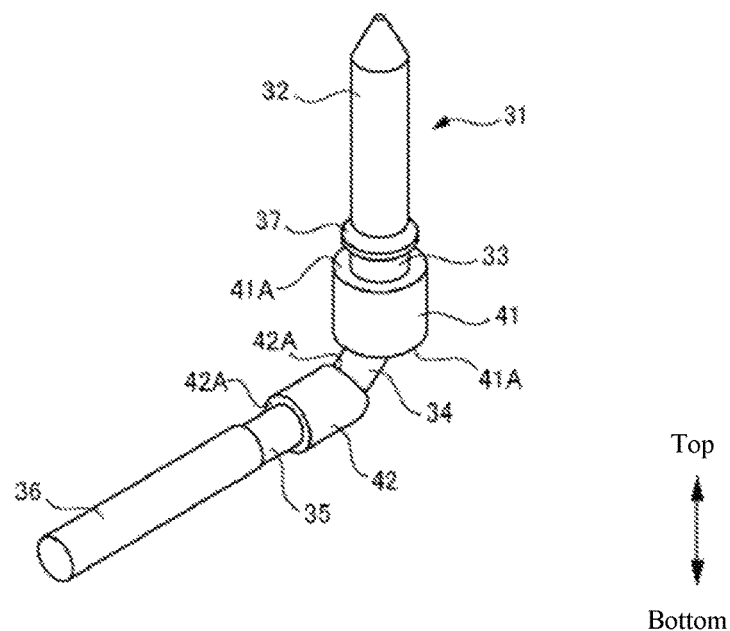
FIG. 6 illustrates an oblique view illustrating a center conductor in a coaxial connector according to Embodiment 1 of the present invention.
Figure 7:
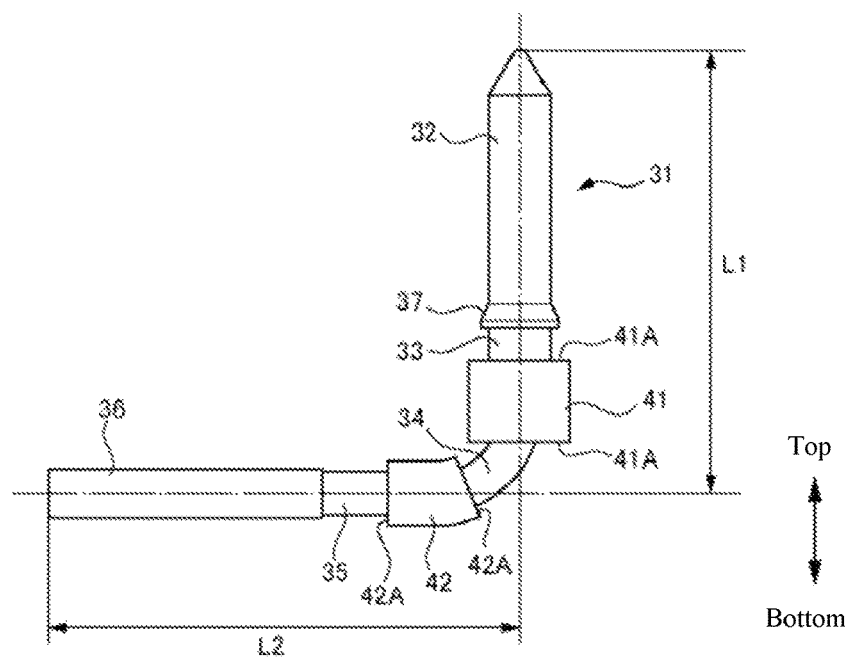
FIG. 7 illustrates an external view illustrating a center conductor in a coaxial connector according to Embodiment 1 of the present invention as viewed from the side.

FIG. 6 and FIG. 7 illustrate the center conductor 31 of the coaxial connector 1. Namely, FIG. 6 is a view of the center conductor 31 from above and FIG. 7 is a view of the center conductor 31 from the side. As shown in FIG. 6, the center conductor 31 is a signal-transmitting terminal formed as an L-shaped rod by cutting and bending a metallic rod made of, for example, brass, phosphor bronze, or the like, plating its surface with nickel and then further plating thereupon with gold or tin.

The center conductor 31 is provided with a contact portion 32, a first coupling portion 33, a bend portion 34, a second coupling portion 35, and a connecting portion 36. Namely, as shown in FIG. 7, a contact portion 32, which comes in contact with the terminal of a counterpart connector, is formed at one end of the central conductor 13. In the present embodiment, the contact portion 32 is of the male type and is formed in a pin-like configuration. The first coupling portion 33, which extends linearly in the axial direction of the outer conductor 11, is coupled to the other end of the contact portion 32. The bend portion 34, which is bent at 90 degrees in the radial direction of the outer conductor 11, is coupled to the other end of the first coupling portion 33. The second coupling portion 35, which extends linearly in the radial direction of the outer conductor 11, is coupled to the other end of the bend portion 34. The connecting portion 36, which connects said center conductor 31 to on-board circuitry, is formed at the other end of the second coupling portion 35. The transverse cross-sectional shape of the contact portion 32, first coupling portion 33, bend portion 34, second coupling portion 35, and connecting portion 36 is circular, and their diameter is, for example, about 0.2-0.8 mm. In addition, the length L1 from the distal end of the contact portion 32 to the bend portion 34 is, for example, about 4-12 mm. Furthermore, the length L2 from the bend portion 34 to the distal end of the connecting portion 36 is, for example, about 3-12 mm. In addition, a collar-shaped engagement portion 37 used to bring the center conductor 31 into engagement with the insulating member 21 is formed in the first coupling portion 33. The collar-shaped engagement portion 37 is in press-fit engagement with the groove-shaped engagement portion 26 of the insulating member 21. It should be noted that the connecting portion 36 at the other end of the center conductor 31, or a portion thereof, may be subjected to press-forming or machining and the like to form a planar face at least in its lower part.

In addition, as shown in FIG. 6, the first expanded portion 41 is formed in the first coupling portion 33 of the center conductor 31. The first expanded portion 41 is formed under the collar-shaped engagement portion 37. Namely, in the first coupling portion 33, a portion of the outer peripheral surface located under the collar-shaped engagement portion 37 expands in the radial direction of the first coupling portion 33. This portion is the first expanded portion 41. The first expanded portion 41 is formed in a cylindrical configuration having a diameter larger than the diameters of both the first coupling portion 33 and the bend portion 34. In addition, the first expanded portion 41 is disposed coaxially with the first coupling portion 33. In addition, the first expanded portion 41 abruptly expands from the outer peripheral surface of the first coupling portion 33 and has end faces 41A normal to the outer peripheral surface of the first coupling portion 33.

In addition, as shown in FIG. 3, the top end face 41A of the first expanded portion 41 abuts the stepped portion 28 of the insulating member 21 and, as a result, defines the position of the center conductor 31 with respect to the insulating member 21 in the vertical direction. Namely, when the center conductor 31 is inserted into the insulating member 21 during the assembly of the coaxial connector 1, the top end face 41A of the first expanded portion 41 abuts the stepped portion 28, and, as a result, the position of the center conductor 31 in the direction of insertion into the insulating member 21 is set to the design position. Accordingly, it is possible to prevent insertion of the center conductor 31 past the design position in the direction of insertion, thus avoiding a forceful impact of the second coupling portion 35 of the center conductor 31 on the slot 29 of the insulating member 21 and application of a large force to the second coupling portion 35, which could result in deformation of the second coupling portion 35.

In addition, as shown in FIG. 6, the second expanded portion 42 is formed in the second coupling portion 35 of the center conductor 31. Namely, in the second coupling portion 35, a portion of the outer peripheral surface on the side proximate the center of the outer conductor 11 expands in the radial direction of the second coupling portion 33. This portion is the second expanded portion 42. The second expanded portion 42 is formed in a cylindrical configuration having a diameter larger than the diameters of both the second coupling portion 35 and the bend portion 34 and is disposed coaxially with the second coupling portion 35. In addition, the second expanded portion 42 has end faces 42A normal to the outer peripheral surface of the second coupling portion 35.

The first expanded portion 41 and second expanded portion 42 are disposed on both sides of the bend portion 34. While the first expanded portion 41 and second expanded portion 42 are disposed distally from each other across the bend portion 34, the two are close to each other. In this embodiment, the first expanded portion 41 is positioned in the lower part of the first coupling portion 33 in FIG. 7, and a portion thereof reaches the upper part of the bend portion 34. In addition, the second expanded portion 42 is positioned in the right part of the second coupling portion 35 in FIG. 7, and a portion thereof reaches the left part of the bend portion 34. As a result, the locations where the first expanded portion 41 and the second expanded portion 42 are formed are within the range of the arc described by the bend portion 34. In addition, in this embodiment, the first expanded portion 41 has a larger diameter, a larger volume, or a larger area of the outer peripheral surface in comparison with the second expanded portion 42.

Figure 8:
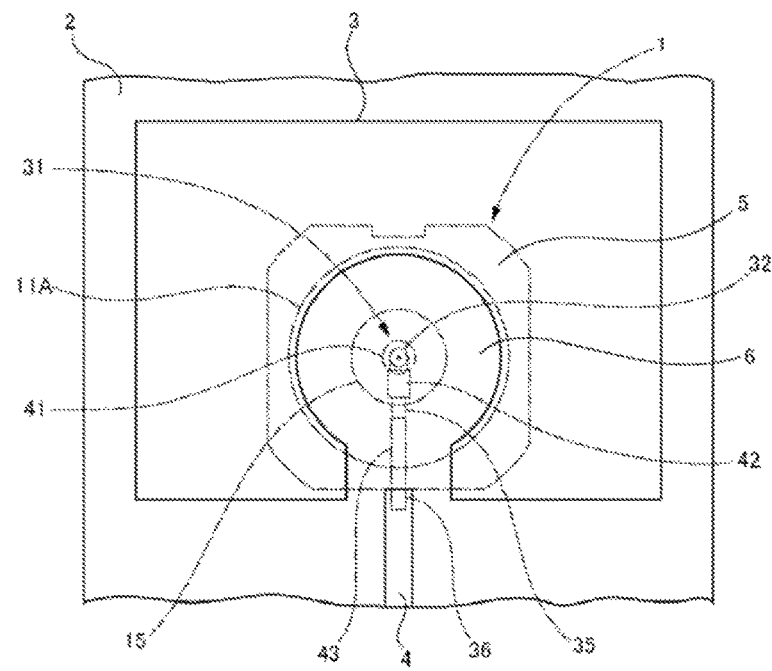
FIG. 8 illustrates an explanatory drawing illustrating the relative positions of a first expanded portion and second expanded portion of a center conductor and an outer conductor, as well as the relative positions of a first expanded portion and second expanded portion of a center conductor and a conductor pattern on a board in a coaxial connector according to Embodiment 1 of the present invention.

FIG. 8 illustrates the relative positions of the first expanded portion 41 and second expanded portion 42 and the outer conductor 11, as well as the relative positions of the first expanded portion 41 and second expanded portion 42 and the conductor pattern 3 on the surface of the board 2. As shown in FIG. 8, when the coaxial connector 1 of the present embodiment is viewed from above, the first expanded portion 41 is disposed in the center of the outer conductor 11, and the second expanded portion 42 is in its entirety disposed inwardly of the outer peripheral surface 11A of the outer conductor 11. In addition, when the coaxial connector 1 is viewed from above, the second expanded portion 42 is disposed inwardly of the insertion portion 15 corresponding to the inner peripheral surface of the support portion 14 of the outer conductor 11. In addition, when the coaxial connector 1 is viewed from above, the second expanded portion 42 partially overlaps with the first expanded portion 41.

Further, the first expanded portion 41 and second expanded portion 42 have the following positions relative to the conductor pattern 3 formed on the surface of the board 2. Namely, as shown in FIG. 8, a conductive region 5, where the conductor pattern 3 is laid down, is formed on the surface of the board 2 in the portion corresponding to the end face of the end portion of the outer conductor 11 on the side proximate the board 2, and a non-conductive region 6, which has no conductor pattern laid down therein, is formed in a portion corresponding to the inner space of the end portion of the outer conductor 11. The first expanded portion 41 and second expanded portion 42 are in their entirety disposed above the non-conductive region 6.

The first expanded portion 41 and second expanded portion 42 are integrally molded with the center conductor 31. Namely, these expanded portions are formed as part of the center conductor 31 when the center conductor 31 is formed by machining a metallic rod.

Forming the first expanded portion 41 and second expanded portion 42 respectively on both sides of the bend portion 34 of the L-shaped center conductor 31 in this manner makes it possible to enhance impedance matching characteristics between the impedance of the coaxial connector 1 and the input impedance or output impedance, etc., of circuitry formed on the board 2 even when high-frequency signals, in particular high-frequency signals in the quasi-millimeter wave band or in the millimeter wave band, flow to the center conductor 31.

Figure 9:
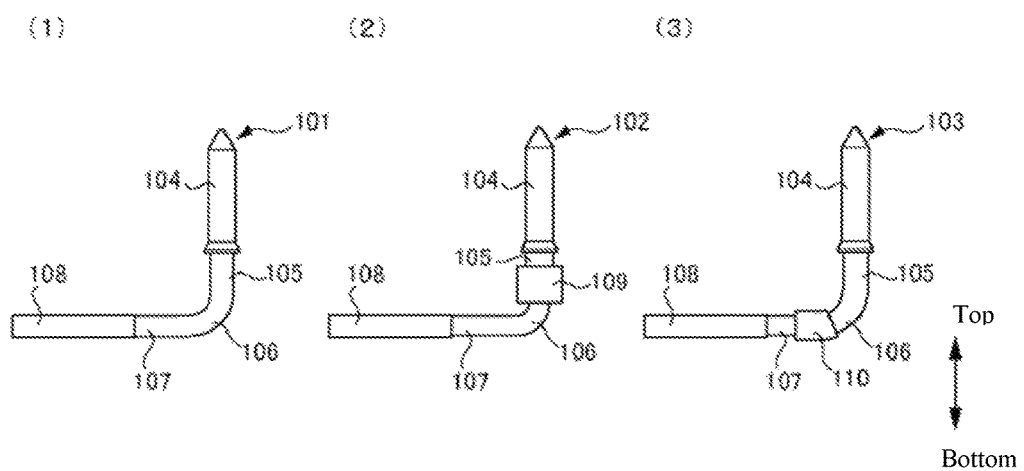
FIG. 9 illustrates external views illustrating center conductors in the coaxial connectors of comparative examples.

Here, the impedance matching characteristics of the coaxial connector 1 will be considered in specific detail. To begin with, a first point will be considered with reference to FIG. 9 and FIG. 10. FIG. 9 illustrates, respectively, a center conductor 101 in a coaxial connector according to Comparative Example 1, a center conductor 102 in a coaxial connector according to Comparative Example 2, and a center conductor 103 in a coaxial connector according to Comparative Example 3. The center conductors 101, 102, and 103 are respectively formed in an L-shaped rod-like configuration provided with a contact portion 104, a first coupling portion 105, a bend portion 106, a second coupling portion 107, and a connecting portion 108. In this respect, they are identical to the center conductor 31 in the coaxial connector 1 according to Embodiment 1 of the present invention. However, neither an expanded portion corresponding to the first expanded portion 41 of the center conductor 31 nor an expanded portion corresponding to the second expanded portion 42 of the center conductor 31 are formed in the center conductor 101. In addition, while an expanded portion 109 corresponding to the first expanded portion 41 of the center conductor 31 is formed in the center conductor 102, an expanded portion corresponding to the second expanded portion 42 of the center conductor 31 is not formed in it. Furthermore, while an expanded portion 110 corresponding to the second expanded portion 42 of the center conductor 31 is formed in the center conductor 103, an expanded portion corresponding to the first expanded portion 41 of the center conductor 31 is not formed in it.

Figure 10:
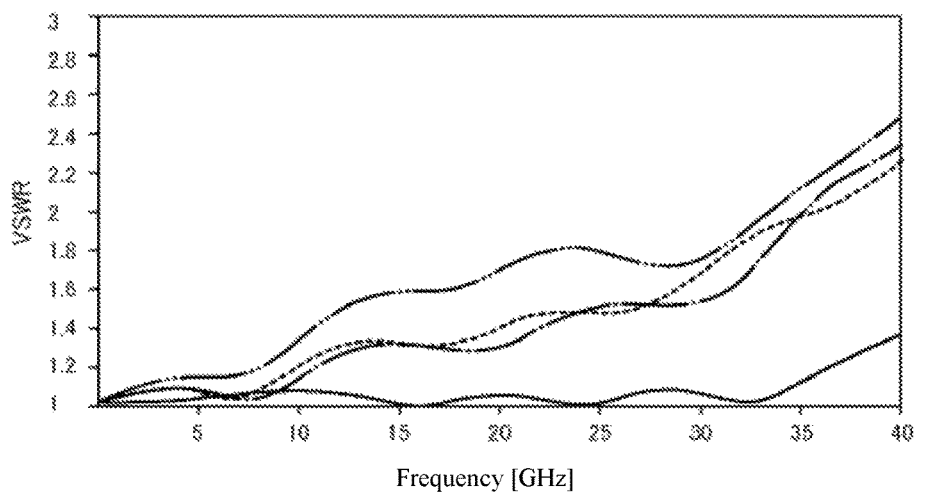
FIG. 10 illustrates a diagram illustrating voltage standing wave ratios (VSWR) obtained on the coaxial connector side respectively when high-frequency signals flow from a signal source to a center conductor in a coaxial connector according to Embodiment 1 of the present invention and when they flow to the center conductors of coaxial connectors used in comparative examples.

In the diagram of FIG. 10, the solid line indicates a voltage standing wave ratio (VSWR) obtained on the coaxial connector side when high-frequency signals flow from a signal source to the center conductor 31 in a coaxial connector 1 according to Embodiment 1 of the present invention. The two-dot chain line indicates a voltage standing wave ratio obtained on the coaxial connector side when high-frequency signals flow from a signal source to the center conductor 101 in a coaxial connector according to Comparative Example 1. The one-dot chain line indicates a voltage standing wave ratio obtained on the coaxial connector side when high-frequency signals flow from a signal source to the center conductor 102 in a coaxial connector according to Comparative Example 2. The dashed line indicates a voltage standing wave ratio obtained on the coaxial connector side when high-frequency signals flow from a signal source to the center conductor 103 in a coaxial connector according to Comparative Example 3. According to FIG. 10, in comparison with any coaxial connector of the comparative examples, the voltage standing wave ratio of the coaxial connector 1 according to Embodiment 1 of the present invention is closer to 1 in most frequency bands starting from direct current to 10 GHz. In addition, its voltage standing wave ratio is closer to 1 in all the frequency bands from 10 GHz to 40 GHz. Thus, it can be seen that forming the first expanded portion 41 and second expanded portion 42 on both sides of the bend portion 34 of the center conductor 31 makes it possible to enhance impedance matching characteristics between the coaxial connector and on-board circuitry in frequency bands below the quasi-millimeter wave band as well as the quasi-millimeter and millimeter wave bands (particularly robustly and significantly in the quasi-millimeter and millimeter wave bands).

Figure 11:
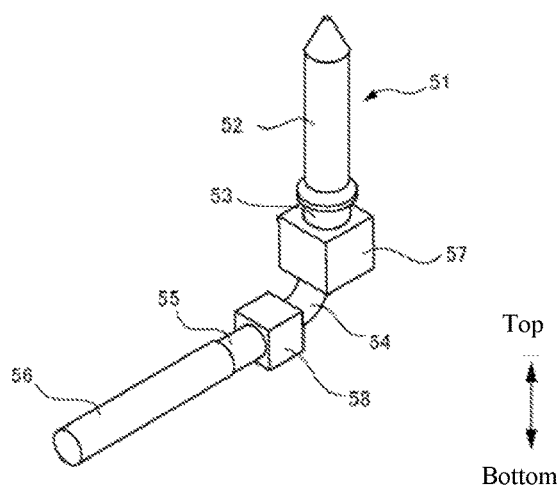
FIG. 11 illustrates an external view illustrating a center conductor in a coaxial connector according to Embodiment 2 of the present invention.
Figure 12:
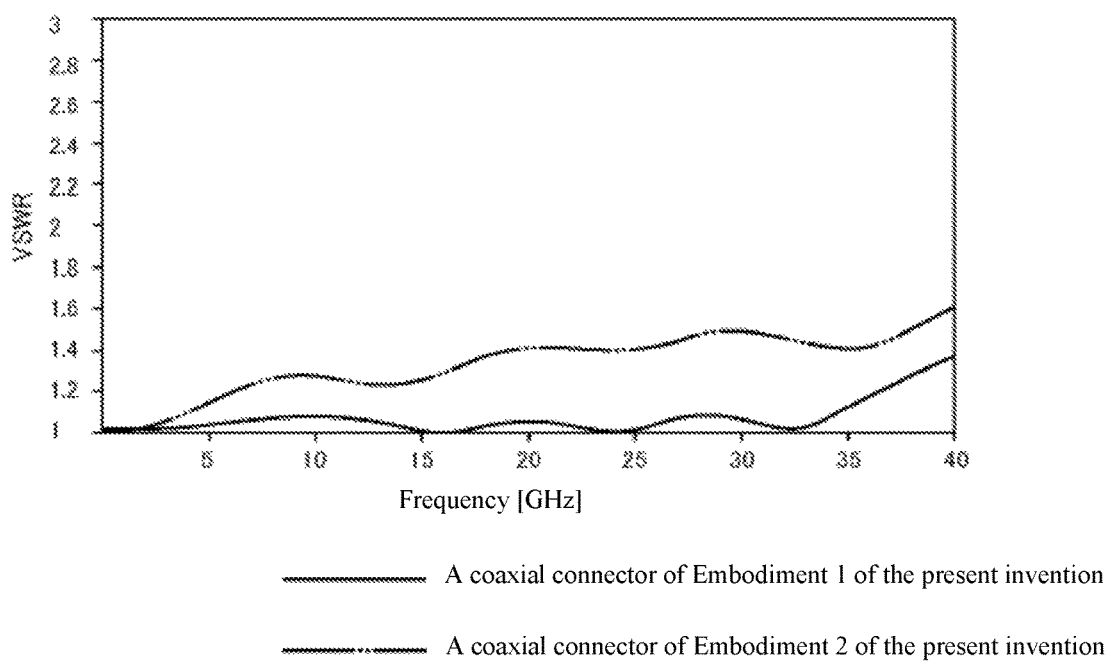
FIG. 12 illustrates a diagram illustrating voltage standing wave ratios obtained on the coaxial connector side respectively when high-frequency signals flow from a signal source to a center conductor in a coaxial connector according to Embodiment 1 of the present invention, and when they flow to a center conductor in a coaxial connector according to Embodiment 2 of the present invention.
Figure 13:
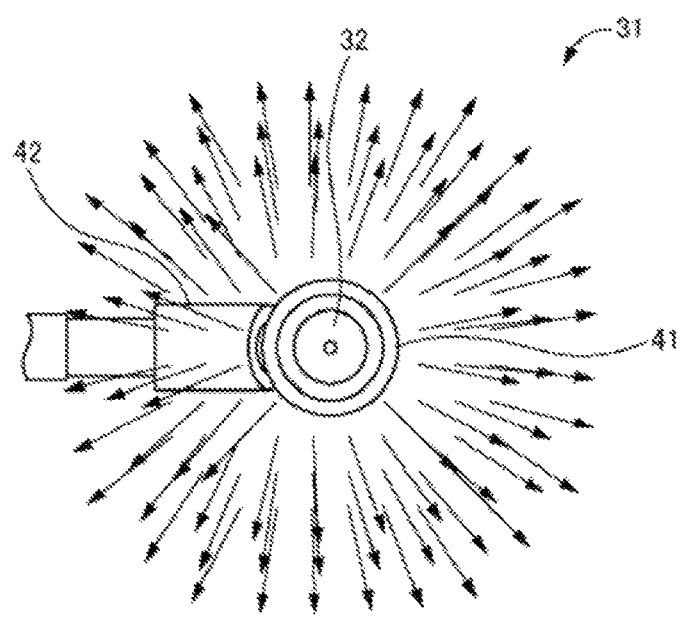
FIG. 13 illustrates explanatory drawings illustrating electric field vector distribution in the vicinity of a first expanded portion formed in center conductors in respective coaxial connectors according to Embodiments 1 and 2 of the present invention.
Figure 13:
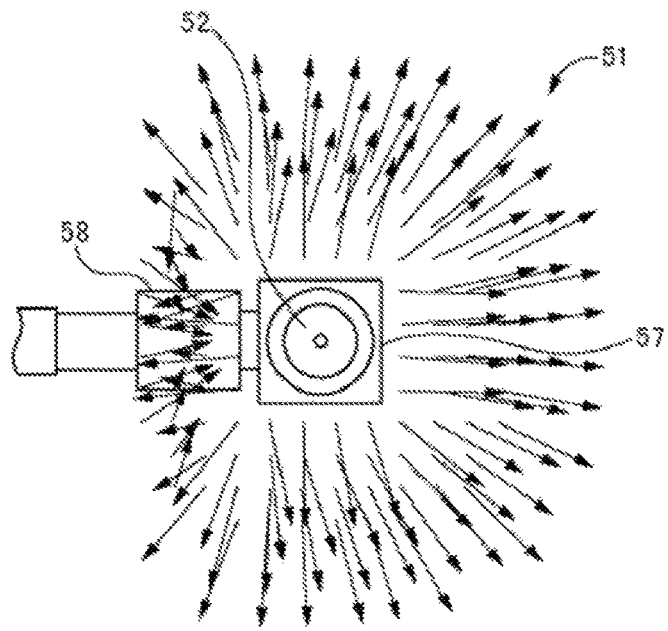

Next, a second point will be considered with reference to FIG. 11, FIG. 12, and FIG. 13. FIG. 11 illustrates a center conductor 51 in a coaxial connector according to Embodiment 2 of the present invention. The center conductor 51 is formed in an L-shaped rod-like configuration provided with a contact portion 52, a first coupling portion 53, a bend portion 54, a second coupling portion 55, and a connecting portion 56, with a first expanded portion 57 formed in the first coupling portion 53 and a second expanded portion 58 formed in the second coupling portion 55. In this respect, it is identical to the center conductor 31 in the coaxial connector 1 according to Embodiment 1 of the present invention. Unlike the center conductor 31, however, the first expanded portion 57 and second expanded portion 58 of the center conductor 51 have a rectangular prism shape.

In the diagram of FIG. 12, the solid line indicates a voltage standing wave ratio obtained on the coaxial connector side when high-frequency signals flow from a signal source to the center conductor 31 in a coaxial connector 1 according to Embodiment 1 of the present invention. The two-dot chain line indicates a voltage standing wave ratio obtained on the coaxial connector side when high-frequency signals flow from a signal source to the center conductor 51 in a coaxial connector according to Embodiment 2 of the present invention. According to FIG. 12, the voltage standing wave ratio of the coaxial connector 1 according to Embodiment 1 of the present invention is closer to 1 in the frequency band between 5 GHz and 40 GHz in comparison with the coaxial connector 1 according to Embodiment 2 of the present invention. Thus, it can be seen that, in comparison with forming rectangular prism-shaped expanded portions, forming cylindrical expanded portions in the center conductor can better enhance impedance matching characteristics between the coaxial connector and on-board circuitry in high-frequency bands below the quasi-millimeter wave band and in the quasi-millimeter and millimeter wave bands.

FIG. 13(1) shows electric field vector distribution in the vicinity of the first expanded portion 41 in the center conductor 31 of the coaxial connector 1 according to Embodiment 1 of the present invention. FIG. 13(2) shows electric field vector distribution in the vicinity of the first expanded portion 57 in the center conductor 51 of the coaxial connector according to Embodiment 2 of the present invention. As shown in FIG. 13(1), electric field vector distribution in the vicinity of the first expanded portion 41 in Embodiment 1 of the present invention is a substantially ideal coaxial mode distribution. By contrast, as shown in FIG. 13(2), electric field vector distribution in the vicinity of the first expanded portion 57 in Embodiment 2 of the present invention exhibits vector direction turbulence. The vector direction turbulence illustrated FIG. 13(2) is believed to be one of the factors explaining why the impedance matching characteristics of the coaxial connector according to Embodiment 2 of the present invention are inferior to the impedance matching characteristics of the coaxial connector 1 according to Embodiment 1 of the present invention.

However, if the voltage standing wave ratio of the coaxial connector according to Embodiment 2 of the present invention, which is shown in FIG. 12, is compared with the voltage standing wave ratios of the coaxial connectors in the comparative examples illustrated in FIG. 10, the former is closer to 1 than the latter in the frequency band between 30 GHz and 40 GHz. Thus, it can be seen that the coaxial connector according to Embodiment 2 of the present invention can also enhance impedance matching characteristics between the coaxial connector and on-board circuitry in the millimeter wave band.

Figure 14:
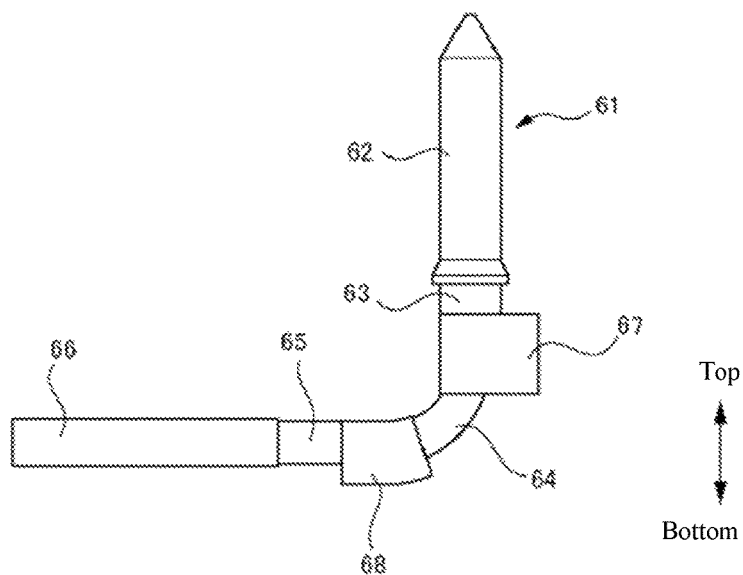
FIG. 14 illustrates an external view illustrating a center conductor in a coaxial connector according to Embodiment 3 of the present invention.
Figure 15:
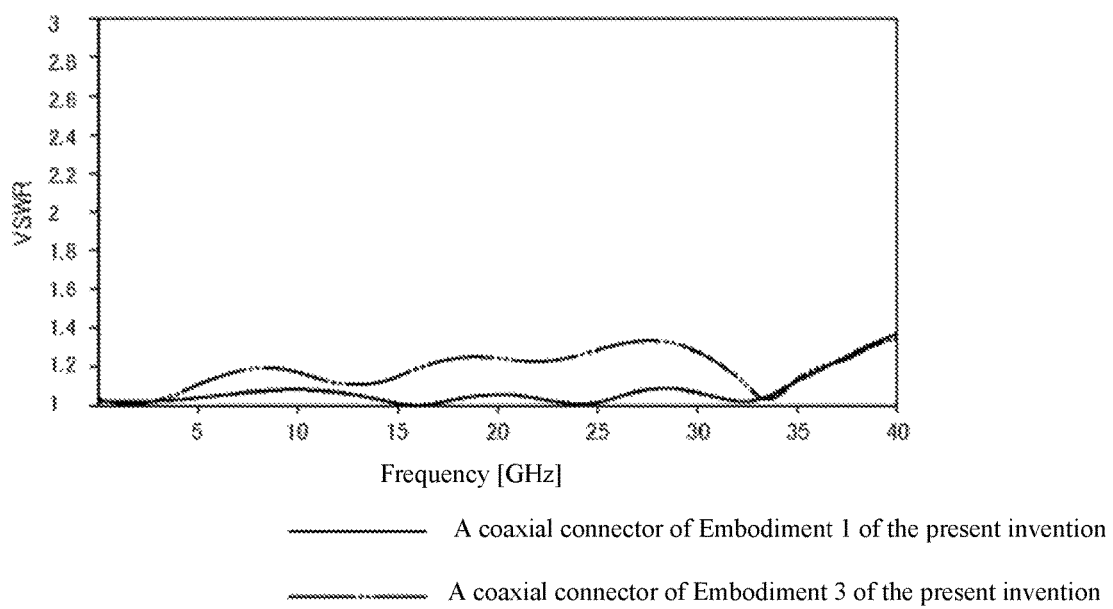
FIG. 15 illustrates a diagram illustrating voltage standing wave ratios obtained on the coaxial connector side respectively when high-frequency signals flow from a signal source to a center conductor in a coaxial connector according to Embodiment 1 of the present invention and when they flow to a center conductor in a coaxial connector according to Embodiment 3 of the present invention.

Next, a third point will be considered with reference to FIG. 14 and FIG. 15. FIG. 14 illustrates a center conductor 61 in a coaxial connector according to Embodiment 3 of the present invention. The center conductor 61 is formed in an L-shaped rod-like configuration provided with a contact portion 62, a first coupling portion 63, a bend portion 64, a second coupling portion 65, and a connecting portion 66, with a first expanded portion 67 formed in the first coupling portion 63 and a second expanded portion 68 formed in the second coupling portion 65. In this respect, it is identical to the center conductor 31 in the coaxial connector 1 according to Embodiment 1 of the present invention. Unlike the center conductor 31, however, the first expanded portion 67 of the center conductor 61 is not disposed coaxially with the first coupling portion 63 and, in addition, the second expanded portion 68 of the center conductor 61 is not disposed coaxially with the second coupling portion 65.

In the diagram of FIG. 15, the solid line indicates a voltage standing wave ratio obtained on the coaxial connector side when high-frequency signals flow from a signal source to the center conductor 31 in a coaxial connector 1 according to Embodiment 1 of the present invention. The two-dot chain line indicates a voltage standing wave ratio obtained on the coaxial connector side when high-frequency signals flow from a signal source to the center conductor 61 in a coaxial connector according to Embodiment 3 of the present invention. According to FIG. 15, the voltage standing wave ratio of the coaxial connector 1 according to Embodiment 1 of the present invention is closer to 1 in the frequency band between 5 GHz and 30 GHz in comparison with the coaxial connector according to Embodiment 3 of the present invention. Thus, it can be seen that disposing the expanded portions coaxially with the center conductor can enhance impedance matching characteristics between the coaxial connector and on-board circuitry in the high-frequency band below the quasi-millimeter wave band and in the quasi-millimeter wave band.

However, if the voltage standing wave ratio of the coaxial connector according to Embodiment 3 of the present invention, which is shown in FIG. 15, is compared with the voltage standing wave ratios of the coaxial connectors in the comparative examples illustrated in FIG. 10, the former is closer to 1 than the latter in the frequency band between 15 GHz and 40 GHz. Thus, it can be seen that the coaxial connector according to Embodiment 3 of the present invention can also enhance impedance matching characteristics between the coaxial connector and on-board circuitry in the quasi-millimeter wave band and in the millimeter wave band.

Figure 16:
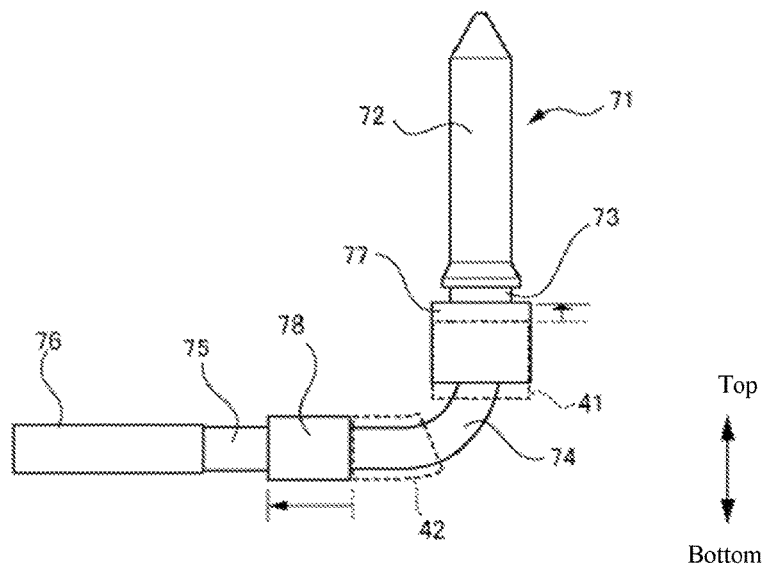
FIG. 16 illustrates an external view illustrating a center conductor in a coaxial connector according to Embodiment 4 of the present invention.
Figure 17:
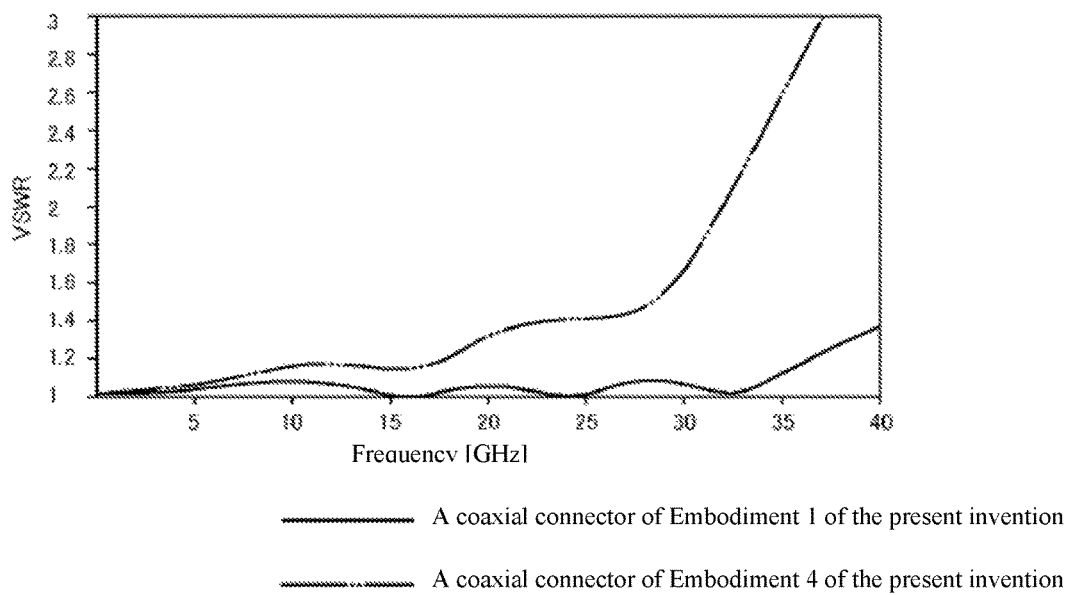
FIG. 17 illustrates a diagram illustrating voltage standing wave ratios obtained on the coaxial connector side respectively when high-frequency signals flow from a signal source to a center conductor in a coaxial connector according to Embodiment 1 of the present invention and when they flow to a center conductor in a coaxial connector according to Embodiment 4 of the present invention.

Next, a fourth point will be considered with reference to FIG. 16 and FIG. 17. FIG. 16 illustrates a center conductor 71 in a coaxial connector according to Embodiment 4 of the present invention. The center conductor 71 is formed in an L-shaped rod-like configuration provided with a contact portion 72, a first coupling portion 73, a bend portion 74, a second coupling portion 75, and a connecting portion 76, with a first expanded portion 77 formed in the first coupling portion 73 and a second expanded portion 78 formed in the second coupling portion 75. In this respect, it is identical to the center conductor 31 in the coaxial connector 1 according to Embodiment 1 of the present invention. However, the first expanded portion 77 of the center conductor 71 is positioned, for example, about 0.15 mm above the first expanded portion 41 of the center conductor 31 and, in addition, the second expanded portion 78 of the center conductor 71 is positioned, for example, about 0.5 mm farther in the radial direction of the outer conductor than the second expanded portion 42 of the center conductor 31. Namely, the distance between the first expanded portion 77 and the bend portion 74 of the center conductor 71 is larger than the distance between the first expanded portion 41 and the bend portion 34 of the center conductor 31, and the distance between the second expanded portion 78 and the bend portion 74 of the center conductor 71 is larger than the distance between the second expanded portion 42 and the bend portion 34 of the center conductor 31. Put otherwise, either the position of the first expanded portion 77 or the position of the second expanded portion 78, or both, is outside the range of the arc described by the bend portion 74.

In the diagram of FIG. 17, the solid line indicates a voltage standing wave ratio obtained on the coaxial connector side when high-frequency signals flow from a signal source to the center conductor 31 in a coaxial connector 1 according to Embodiment 1 of the present invention. The two-dot chain line indicates a voltage standing wave ratio obtained on the coaxial connector side when high-frequency signals flow from a signal source to the center conductor 71 in a coaxial connector according to Embodiment 4 of the present invention. According to FIG. 17, the voltage standing wave ratio of the coaxial connector 1 according to Embodiment 1 of the present invention is closer to 1 in the frequency band between from 5 GHz and 40 GHz in comparison with the coaxial connector according to Embodiment 4 of the present invention. Thus, it can be seen that bringing both of the first expanded portion and second expanded portion closer to the bend portion of the center conductor can enhance impedance matching characteristics between the coaxial connector and on-board circuitry in the high-frequency band below the quasi-millimeter wave band, in the quasi-millimeter wave band, and in the millimeter wave band.

However, if the voltage standing wave ratio of the coaxial connector of Embodiment 4 of the present invention, which is shown in FIG. 17, is compared with the voltage standing wave ratios of the coaxial connectors in the comparative examples illustrated in FIG. 10, its voltage standing wave ratio is closer to 1 in most frequency bands between 10 GHz and 30 GHz. Thus, it can be seen that the coaxial connector according to Embodiment 4 of the present invention can also enhance impedance matching characteristics between the coaxial connector and on-board circuitry in almost all of the quasi-millimeter wave band.

Figure 18:
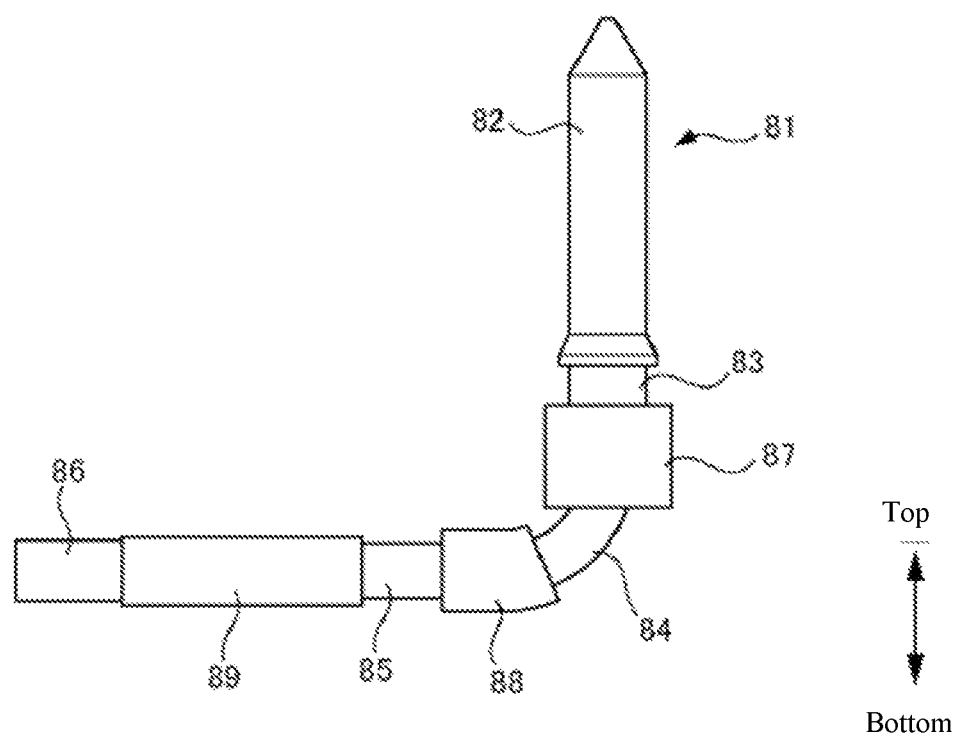
FIG. 18 illustrates an external view illustrating a center conductor in a coaxial connector according to Embodiment 5 of the present invention.

FIG. 18 illustrates a center conductor 81 in a coaxial connector according to Embodiment 5 of the present invention. In the same manner as the center conductor 31 in the coaxial connector 1 according to Embodiment 1 of the present invention, the center conductor 81 is provided with a contact portion 82, a first coupling portion 83, a bend portion 84, a second coupling portion 85, a connecting portion 86, a first expanded portion 87, and a second expanded portion 88. In addition to this, the second coupling portion 85 of the center conductor 81 has an adjustment portion 89, which is formed in a portion located farther in the radial direction of the outer conductor than the second expanded portion 88. The adjustment portion 89 is formed by making the diameter dimensions of the second coupling portion 85 partially larger or smaller. Although the adjustment portion 89 forms a step on the peripheral surface of the second coupling portion 85, the step formed by the adjustment portion 89 on the peripheral surface of the second coupling portion 85 is smaller than the step (projection)

formed by the second expanded portion 88 on the peripheral surface of the second coupling portion 85. In addition, in the adjustment portion 89, the number of portions where the diameter dimensions of the second coupling portion 85 are increased (or portions where they are decreased) is not limited to 1, and may be 2 or more. The adjustment portion 89 can be used to finely adjust the impedance of the coaxial connector. It should be noted that the impedance of the coaxial connector can be fine-tuned by changing the diameter dimensions of the connecting portion 86.

It should be noted that the present invention can be appropriately modified as long as the modifications do not contradict the gist or concept of the invention that can be read from its claims and specification taken in its entirety, and coaxial connectors based on those types of modifications are within the inventive concept of the present invention.

DESCRIPTION OF THE REFERENCE NUMERALS

1 Coaxial connector
2 Board
3, 4 Conductor patterns
5 Conductive region
6 Non-conductive region
11 Outer conductor
11A Outer peripheral surface
21 Insulating member
25 Access hole
27 Receiving portion
28 Stepped portion
31, 51, 61, 71, 81 Center conductors
32, 52, 62, 72, 82 Contact portions
33, 53, 63, 73, 83 First coupling portions
34, 54, 64, 74, 84 Bend portions
35, 55, 65, 75, 85 Second coupling portions
36, 56, 66, 76, 86 Connecting portions
41, 57, 67, 77, 87 First expanded portions
42, 58, 68, 78, 88 Second expanded portions
89 Adjustment portion

What is claimed is:

1. A board-mounted coaxial connector provided with a tubular outer conductor and a center conductor provided inside the outer conductor, wherein the center conductor comprises:
   a contact portion, which is in contact with the terminal of a counterpart connector;
   a first coupling portion, which couples to the contact portion and extends in the axial direction of the outer conductor;
   a bend portion, which couples to the first coupling portion and is bent in the radial direction of the outer conductor;
   a second coupling portion, which couples to the bend portion and extends in said radial direction; and
   a connecting portion, which couples to the second coupling portion and connects said center conductor to on-board circuitry, and wherein a first expanded portion, which is produced by an expansion of a portion of the outer peripheral surface of said first coupling portion, is formed in the first coupling portion between the bend portion and the contact portion, the first expanded portion having a diameter larger than that of the bend portion, and
   a second expanded portion, which is produced by an expansion of a portion of the outer peripheral surface of said second coupling portion, is formed in the second coupling portion and adjacent to the connecting portion;
   wherein there is provided an insulating member that supports the center conductor on the outer conductor;
   the insulating member comprises:
   an access hole, which permits passage of the contact portion, and
   a receiving portion formed below the contact portion, which is a hole with a diameter larger than the diameter of the access hole and which receives the first expanded portion and configured to contain at least the first expanded portion and the bend portion, wherein the bend portion is contained within an inner space of the receiving portion;
   wherein the access hole and the receiving portion are formed in a stem portion of the insulating member extending along an axial direction of the connector;
   wherein the board-mounted coaxial connector is mounted to the board such that an axial line of the board-mounted coaxial connector is perpendicular to the surface of the board.

2. The coaxial connector according to claim 1, wherein the first expanded portion is formed in a cylindrical configuration having a diameter larger than the diameter of the first coupling portion.

3. The coaxial connector according to claim 1, wherein the second expanded portion is formed in a cylindrical configuration having a diameter larger than the diameter of the second coupling portion.

4. The coaxial connector according to claim 1, wherein the first expanded portion is disposed coaxially with the first coupling portion.

5. The coaxial connector according to claim 1, wherein the second expanded portion is disposed coaxially with the second coupling portion.

6. The coaxial connector according to claim 1, wherein the second expanded portion is disposed inwardly of the outer peripheral surface of the outer conductor.

7. The coaxial connector according to claim 1, wherein on the surface of the board, a conductive region, which has laid down therein a conductor pattern, is formed in a portion corresponding to the end face of the end portion of the outer conductor on the side proximate the board; a non-conductive region, which has no conductor pattern laid down therein, is formed in a portion corresponding to the space inside the end portion of the outer conductor; and the second expanded portion is disposed in the non-conductive region.

8. The coaxial connector according to claim 1, wherein the insulating member comprises:
   a stepped portion, which is formed between the access hole and the receiving portion; and the first expanded portion abuts the stepped portion.

9. The coaxial connector according to claim 1, wherein, in the second coupling portion of the center conductor, there is formed an adjustment portion, which is formed by partially changing the diameter dimensions of the second coupling portion, in a portion located farther in the radial direction of the outer conductor than the second expanded portion.

* * * * *